(12) United States Patent
Yang et al.

(10) Patent No.: US 12,492,340 B2
(45) Date of Patent: Dec. 9, 2025

(54) ETCHANT

(71) Applicants: Samsung Display Co., Ltd., Yongin-si (KR); DONGWOO FINE-CHEM Co., Ltd., Iksan-si (KR)

(72) Inventors: Shinhyuk Yang, Yongin-si (KR); Beomsoo Kim, Iksan-si (KR); Hyeonsu Cho, Iksan-si (KR); Jeehoon Kim, Yongin-si (KR); Youngjin Yoon, Iksan-si (KR); Eunwon Lee, Iksan-si (KR); Donghan Kang, Yongin-si (KR); Jihun Park, Yongin-si (KR); Jongmoo Huh, Yongin-si (KR)

(73) Assignees: Samsung Display Co., Ltd., Yongin-si (KR); DONGWOO FINE-CHEM Co., Ltd., Iksan-si (KR)

( * ) Notice: Subject to any disclaimer, the term of this patent is extended or adjusted under 35 U.S.C. 154(b) by 231 days.

(21) Appl. No.: 18/179,919

(22) Filed: Mar. 7, 2023

(65) Prior Publication Data
US 2023/0295504 A1   Sep. 21, 2023

(30) Foreign Application Priority Data
Mar. 21, 2022 (KR) .......................... 10-2022-0034934

(51) Int. Cl.
*C09K 13/08* (2006.01)
(52) U.S. Cl.
CPC .................................. *C09K 13/08* (2013.01)
(58) Field of Classification Search
None
See application file for complete search history.

(56) References Cited

U.S. PATENT DOCUMENTS

| | | | |
|---|---|---|---|
| 6,527,622 B1 * | 3/2003 | Brusic | C23F 3/06 451/36 |
| 8,262,928 B2 | 9/2012 | Kim et al. | |
| 8,637,399 B2 | 1/2014 | Park et al. | |
| 9,133,550 B2 * | 9/2015 | Kim | C23F 1/26 |
| 10,941,342 B2 | 3/2021 | Kim et al. | |
| 2006/0030158 A1 * | 2/2006 | Carter | C09K 3/1463 438/692 |
| 2006/0226122 A1 * | 10/2006 | Wojtczak | C09K 13/00 257/E21.309 |

(Continued)

FOREIGN PATENT DOCUMENTS

| | | |
|---|---|---|
| KR | 10-2013-0051239 A | 5/2013 |
| KR | 10-1619380 B1 | 5/2016 |
| KR | 10-1702129 B1 | 2/2017 |

(Continued)

*Primary Examiner* — Shamim Ahmed
(74) *Attorney, Agent, or Firm* — Womble Bond Dickinson (US) LLP

(57) ABSTRACT

An etchant including: persulfate; a fluorine-containing compound; a chlorine-containing compound; a cyclic amine compound; an inorganic acid; a first compound; and water, wherein the first compound is a compound containing: a sulfonic group, a sulfonic acid group, or a combination thereof; and an amine group, and an interfacial permeation inhibition index (Y) of the etchant is a value of at least about 0.10 and not more than about 0.35, the interfacial permeation inhibition index (Y) being a value calculated by Equation 1. The description of Equation 1 is as in the specification.

20 Claims, 8 Drawing Sheets

(56) References Cited

U.S. PATENT DOCUMENTS

2009/0226616 A1* 9/2009 Haijima .................. B41N 3/08
427/256

FOREIGN PATENT DOCUMENTS

| KR | 10-1745721 B1 | 6/2017 |
| KR | 10-1805185 B1 | 12/2017 |
| KR | 10-2020-0011394 A | 2/2020 |
| KR | 10-2020-0114900 A | 10/2020 |

* cited by examiner

ETCHANT

CROSS-REFERENCE TO RELATED APPLICATION

This application claims priority to and the benefit of Korean Patent Application No. 10-2022-0034934, filed on Mar. 21, 2022, in the Korean Intellectual Property Office, the disclosure of which is incorporated by reference herein in its entirety.

BACKGROUND

1. Field

Embodiments of the present disclosure described herein relate to an etchant.

2. Description of the Related Art

In accordance with the progress in the field of display devices that express one or more suitable electrical signal information (e.g., in the field of informational technology), one or more suitable flat display devices with excellent or suitable characteristics such as reduced thickness, lighter weight, and low power consumption are being studied and developed. Among these display devices, organic light-emitting display devices may be manufactured to be lightweight and thin, and have the advantages of relatively wide viewing angles and rapid response rates, thus drawing attention as next-generation display devices.

SUMMARY

Aspects of embodiments are directed toward an etchant capable of etching a multilayer film.

Additional aspects will be set forth in part in the description which follows and, in part, will be apparent from the description, or may be learned by practice of the presented embodiments of the disclosure.

According to an embodiment, an etchant includes: persulfate; a fluorine-containing compound; a chlorine-containing compound; a cyclic amine compound; an inorganic acid; a first compound; and water, wherein the first compound is a compound containing: a sulfonic group, a sulfonic acid group, or a combination thereof; and an amine group, and an interfacial permeation inhibition index (Y) of the etchant is a value of at least 0.10 and not more than 0.35, the interfacial permeation inhibition index (Y) being a value calculated by <Equation 1>:

$$Y = 1.4 \times 10^{-4} \times M(X1) + 1.3 \times 10^{-4} \times M(X2) + 1.45 \times 10^{-3} \times M(X3) + 1.5 \times 10^{-5} \times M(X1) \times M(X2) + 1.6 \times 10^{-3} M(X1) \times M(X3) + 6.5 \times 10^{-4} \times M(X2) \times M(X3)$$

Equation 1 wherein, in Equation 1, $M(X1)$ indicates wt % of the first compound with respect to 100 wt % in total of the etchant, $M(X2)$ indicates wt % of the chlorine-containing compound with respect to 100 wt % in total of the etchant, and $M(X3)$ indicates wt % of the water with respect to 100 wt % in total of the etchant.

BRIEF DESCRIPTION OF THE DRAWINGS

The above and other aspects, features, and advantages of certain embodiments of the disclosure will be more apparent from the following description taken in conjunction with the accompanying drawings.

DETAILED DESCRIPTION

Figure 1:
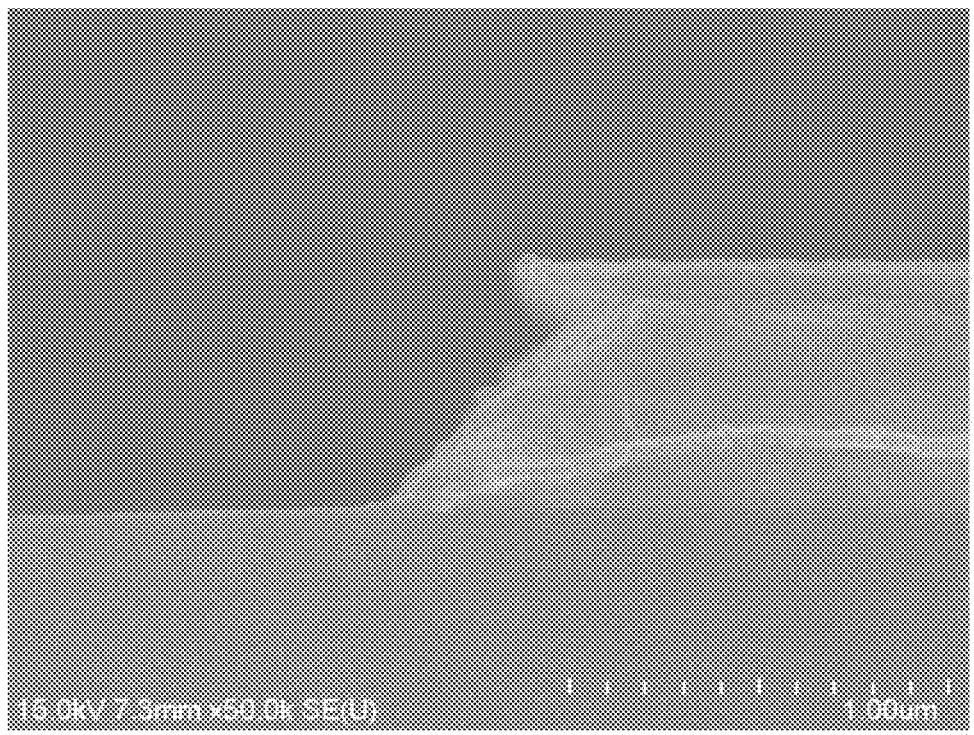
FIGS. 1-3 show results of observation of etched samples of Examples 1-3, respectively, using a scanning electron microscope according to the present disclosure.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the disclosure, the expression "at least one of a, b or c" indicates only a, only b, only c, both (e.g., simultaneously) a and b, both (e.g., simultaneously) a and c, both (e.g., simultaneously) b and c, all of a, b, and c, or variations thereof.

The disclosure may include one or more suitable modifications and one or more suitable embodiments, and specific embodiments will be illustrated in the accompanying drawings and described in more detail in the detailed description. The effects and features of the present disclosure and way to implement the same will become clear with reference to the embodiments described below in more detail along with the drawings. However, the disclosure is not limited to the embodiments disclosed below and may be implemented in one or more suitable forms.

As used herein, the terms "first", "second", etc., are used only to distinguish one component from another, not for purposes of limitation.

As used herein, the singular forms "a", "an", and "the" are intended to include the plural forms as well, unless the context clearly indicates otherwise.

As used herein, the terms such as "including", "having", and/or the like are intended to indicate the existence of the features or elements disclosed in the specification, and are not intended to preclude the possibility that one or more other features or elements may exist or may be added.

As used herein, when an element such as a layer, a film, a region or a component is referred to as being "on" another element, it can be "directly on" the other element, or intervening layers, films, regions, or components may also be present.

In the drawings, the sizes of elements are exaggerated or reduced for ease of description. For example, the size or thickness of each element shown in the drawings are arbitrarily illustrated for ease of description, and thus the present disclosure is not limited thereto.

According to an embodiment, an etchant includes: persulfate; a fluorine-containing compound; a chlorine-containing compound; a cyclic amine compound; an inorganic acid; a first compound; and water, wherein the first compound is a compound containing: a sulfonic group, a sulfonic acid group, or a combination thereof; and an amine group, and an interfacial permeation inhibition index (Y) of the etchant is a value of at least about 0.10 and not more than about 0.35, the interfacial permeation inhibition index (Y) being a value calculated by <Equation 1>:

$$Y=1.4\times10^{-4}\times M(X1)+1.3\times10^{-4}\times M(X2)+1.45\times10^{-3}\times M(X3)+1.5\times10^{-5}\times M(X1)\times M(X2)+1.6\times10^{-3}M(X1)\times M(X3)+6.5\times10^{-4}\times M(X2)\times M(X3)$$ Equation 1 wherein, in Equation 1,

M(X1) indicates wt % of the first compound with respect to 100 wt % in total of the etchant, M(X2) indicates wt % of the chlorine-containing compound with respect to 100 wt % in total of the etchant, and M(X3) indicates wt % of the water with respect to 100 wt % in total of the etchant.

In one or more embodiments, the persulfate in the etchant may include ammonium persulfate, sodium persulfate, potassium persulfate, or one or more combinations thereof. The persulfate is a main etch component and may control the etch rate. For example, the persulfate may include ammonium persulfate. For another example, the persulfate may be ammonium persulfate. In some embodiments, when a display device is manufactured using the etchant in which the persulfate includes sodium (Na) (for example, the persulfate is sodium persulfate), a silicon (Si)-containing precipitate (for example, $Na_2SiF_6$) may be generated by reaction with a glass substrate. However, when the persulfate does not include Na, the amount of the Si-containing precipitate generated may be lowered, thus resulting in a defect rate reduction of display devices. In some embodiments, when manufacturing a display device using the etchant in which the persulfate includes potassium (K) (for example, when the persulfate is potassium persulfate), the decomposition rate may increase over time, and due to lower solubility in water compared to ammonium persulfate or sodium persulfate, the manufacturing time may increase. However, when the persulfate does not include K, the effects of increased stability and reduced manufacturing time may be obtained.

For example, an amount of the persulfate may be at least about 3.0 wt % and not more than about 15.0 wt % with respect to 100 wt % in total of the etchant. When the persulfate is included in an amount of less than about 3.0 wt %, etching may not occur or the etch rate may be reduced. When the persulfate is included to exceed about 15.0 wt %, it is difficult to control the etch rate, and anions excessively increase, thus lowering etch uniformity of the multilayer film.

In one or more embodiments, the fluorine-containing compound in the etchant may be ammonium fluoride, sodium fluoride, potassium fluoride, ammonium bifluoride, sodium bifluoride, potassium bifluoride, or one or more combinations thereof. The fluorine-containing compound may reduce residues and/or tips that may be generated during etching. The fluorine-containing compound may be a compound in which fluoride ions or polyatomic fluorine ions are dissolved in solution.

For example, an amount of the fluorine-containing compound may be at least about 0.10 wt % and not more than about 2.0 wt % with respect to 100 wt % in total of the etchant. For another example, an amount of the fluorine-containing compound may be at least about 0.6 wt % and not more than about 1.0 wt %. When the fluorine-containing compound is included in an amount of less than about 0.10 wt %, the etch rate may be reduced, thus generating residues and/or tips. When the fluorine-containing compound is included in more than about 2.0 wt %, a substrate (for example, a substrate constituting the base of a wire substrate including wires, and/or a silicon-based insulating layer) may be damaged.

In one or more embodiments, the chlorine-containing compound in the etchant may include hydrochloric acid, sodium chloride, potassium chloride, ammonium chloride, iron (III) chloride, sodium perchlorate, potassium perchlorate, ethanesulfonyl chloride, methanesulfonyl chloride, or one or more combinations thereof. The chlorine-containing compound improves critical dimension (CD) loss of patterned wires by improving the etch rate, and thus may improve process margin. In some embodiments, by preventing or reducing over-etching of wires, the yield may be improved. Critical dimension (CD) loss is one of the pattern profile failures occurring when there is no large difference in etch rate between those in vertical and horizontal directions, and may refer to a failure in which wiring is not normally achieved due to a reduced horizontal distance between the end of a mask pattern for etching (for example, a photoresist pattern) and the end of an etched pattern.

For example, an amount of the chlorine-containing compound may be at least about 0.01 wt % and not more than about 2.0 wt % with respect to 100 wt % in total of the etchant. For another example, an amount of the fluorine-containing compound may be at least about 0.01 wt % and not more than about 1.5 wt %. When the chlorine-containing compound is included in an amount of less than about 0.01 wt %, the etch rate may be reduced, thus causing residues to occur. In some embodiments, because over-etching of wiring cannot be prevented or suitably reduced, the yield may be reduced. When the chlorine-containing compound is included to exceed about 1.0 wt %, the etch rate may excessively increase, thus reducing etch uniformity.

In one or more embodiments, the cyclic amine compound in the etchant may include 5-aminotetrazole, imidazole, indole, purine, pyrazole, pyridine, pyrimidine, pyrrole, pyrrolidine, pyrroline, 5-methyltetrazole, 1-methyl-5-aminotetrazole, 1-ethyl-5-aminotetrazole, or one or more combinations thereof. The cyclic amine compound may control the etch rate, improve etch uniformity, and form a profile.

For example, an amount of the cyclic amine compound in the etchant may be at least about 0.10 wt % and not more than about 2.0 wt % with respect to 100 wt % in total of the etchant. When the cyclic amine compound is included in an amount of less than about 0.10 wt %, the etch rate is not controllable, thus causing over-etching or substantially non-uniform etching. When the cyclic amine compound is included to exceed about 2.0 wt %, the etch rate may be reduced, thus lowering efficiency.

In one or more embodiments, the inorganic acid in the etchant may include nitric acid, sulfuric acid, phosphoric acid, phosphorous acid, or one or more combinations thereof. The inorganic acid may be an auxiliary oxidizer for etching.

For example, an amount of the inorganic acid may be at least about 0.10 wt % and not more than about 5.0 wt % with respect to 100 wt % in total of the etchant. When the inorganic acid is included in an amount of less than about 0.10 wt %, the etch rate may be reduced, thus causing residues or a failure in profile to occur. When the inorganic acid is included to exceed about 5.0 wt %, over-etching may occur, or cracking in photoresist may occur, thus lowering productivity.

The first compound may be a compound containing: a sulfonic group, a sulfonic acid group, or a combination thereof; and an amine group. For example, the first compound may be a compound that is neutral in an aqueous solution.

In one or more embodiments, the first compound in the etchant may be a compound containing a sulfonic group and an amine group; or a compound containing a sulfonic acid group and an amine group.

For example, the amine group in the first compound may be —NH$_2$. However, embodiments are not limited thereto.

In one or more embodiments, the first compound in the etchant may be a compound represented by Formula 1:

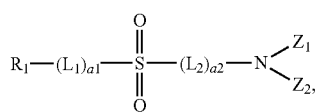

Formula 1 wherein, in Formula 1,

L$_1$ and L$_2$ may each independently be single bond, *—O—*', *—S—*', a C$_1$-C$_{20}$ alkylene group unsubstituted or substituted with at least one R$_{10a}$, a C$_2$-C$_{20}$ alkenylene group unsubstituted or substituted with at least one R$_{10a}$, a C$_3$-C$_{60}$ carbocyclic group unsubstituted or substituted with at least one R$_{10a}$, or a C$_1$-C$_{60}$ heterocyclic group unsubstituted or substituted with at least one R$_{10a}$, a1 and a2 may each independently be one of an integer from 0 to 3, R$_1$, Z$_1$, and Z$_2$ may each independently be hydrogen, deuterium, —F, —Cl, —Br, —I, a hydroxyl group, a cyano group, a nitro group, a C$_1$-C$_{60}$ alkyl group unsubstituted or substituted with at least one R$_{10a}$, a C$_2$-C$_{60}$ alkenyl group unsubstituted or substituted with at least one R$_{10a}$, a C$_2$-C$_{60}$ alkynyl group unsubstituted or substituted with at least one R$_{10a}$, a C$_1$-C$_{60}$ alkoxy group unsubstituted or substituted with at least one R$_{10a}$, a C$_3$-C$_{60}$ carbocyclic group unsubstituted or substituted with at least one R$_{10a}$, a C$_1$-C$_{60}$ heterocyclic group unsubstituted or substituted with at least one R$_{10a}$, a C$_6$-C$_{60}$ aryloxy group unsubstituted or substituted with at least one R$_{10a}$, a C$_6$-C$_{60}$ arylthio group unsubstituted or substituted with at least one R$_{10a}$, —N(Q$_1$)(Q$_2$), —B(Q$_1$)(Q$_2$), —P(Q$_1$)(Q$_2$), or —C(=O)(Q$_1$), but R$_1$ is not hydrogen, Z$_1$ and Z$_2$ may optionally be linked to each other, via a single bond, a C$_1$-C$_5$ alkylene group unsubstituted or substituted with at least one R$_{10a}$, or a C$_2$-C$_5$ alkenylene group unsubstituted or substituted with at least one R$_{10a}$, to form a C$_8$-C$_{60}$ polycyclic group unsubstituted or substituted with at least one R$_{10a}$, and R$_{10a}$ may be deuterium (-D), —F, —Cl, —Br, —I, a hydroxyl group, a cyano group, or a nitro group, a C$_1$-C$_{60}$ alkyl group, a C$_2$-C$_{60}$ alkenyl group, a C$_2$-C$_{60}$ alkynyl group, or a C$_1$-C$_{60}$ alkoxy group, each being unsubstituted or substituted with deuterium, —F, —Cl, —Br, —I, a hydroxyl group, a cyano group, a nitro group, a C$_3$-C$_{60}$ carbocyclic group, a C$_1$-C$_{60}$ heterocyclic group, a C$_6$-C$_{60}$ aryloxy group, a C$_6$-C$_{60}$ arylthio group, —Si(Q$_{11}$)(Q$_{12}$)(Q$_{13}$), —N(Q$_{11}$)(Q$_{12}$), —B(Q$_{11}$)(Q$_{12}$), —C(=O)(Q$_{11}$), —S(=O)$_2$(Q$_{11}$), —P(=O)(Q$_{11}$)(Q$_{12}$), or one or more combinations thereof, a C$_3$-C$_{60}$ carbocyclic group, a C$_1$-C$_{60}$ heterocyclic group, a C$_6$-C$_{60}$ aryloxy group, or a C$_6$-C$_{60}$ arylthio group, each being unsubstituted or substituted with deuterium, —F, —Cl, —Br, —I, a hydroxyl group, a cyano group, a nitro group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{60}$ carbocyclic group, a C$_1$-C$_{60}$ heterocyclic group, a C$_6$-C$_{60}$ aryloxy group, a C$_6$-C$_{60}$ arylthio group, —Si(Q$_{21}$)(Q$_{22}$)(Q$_{23}$), —N(Q$_{21}$)(Q$_{22}$), —B(Q$_{21}$)(Q$_{22}$), —C(=O)(Q$_{21}$), —S(=O)$_2$(Q$_{21}$), —P(=O)(Q$_{21}$)(Q$_{22}$), or one or more combinations thereof, or —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), or —P(=O)(Q$_{31}$)(Q$_{32}$), wherein Q$_1$ to Q$_3$, Q$_{11}$ to Q$_{13}$, Q$_{21}$ to Q$_{23}$, and Q$_{31}$ to Q$_{33}$ may each independently be: hydrogen; deuterium; —F; —Cl; —Br; —I; a hydroxyl group; a cyano group; a nitro group; a C$_1$-C$_{60}$ alkyl group; a C$_2$-C$_{60}$ alkenyl group; a C$_2$-C$_{60}$ alkynyl group; a C$_1$-C$_{60}$ alkoxy group; or a C$_3$-C$_{60}$ carbocyclic group or a C$_1$-C$_{60}$ heterocyclic group, each being unsubstituted or substituted with deuterium, —F, a cyano group, a C$_1$-C$_{60}$ alkyl group, a C$_1$-C$_{60}$ alkoxy group, a phenyl group, a biphenyl group, or one or more combinations thereof.

In one or more embodiments, in Formula 1, L$_1$ and L$_2$ may each independently be a single bond, *—O—*', or *—S—*';

a C$_1$-C$_{20}$ alkylene group, a C$_2$-C$_{20}$ alkenylene group, or a C$_2$-C$_{20}$ alkynylene group, each being unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), —P(=O)(Q$_{31}$)(Q$_{32}$), or one or more combinations thereof; or a cyclopentylene group, a cyclohexylene group, a cycloheptylene group, a cyclooctylene group, an adamantanylene group, a norbornanylene group, a norbornenylene group, a cyclopentenylene group, a cyclohexenylene group, a cycloheptenylene group, a phenylene group, a naphthylene group, a fluorenylene group, a phenanthrenylene group, an anthracenylene group, a fluoranthenylene group, a triphenylenylene group, a pyrenylene group, a chrysenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a quinoxalinylene group, a quinazolinylene group, a cinolinylene group, a carbazolylene group, a phenanthrolinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, an imidazopyridinylene group, or an imidazopyrimidinylene group, each being unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a C$_1$-C$_{20}$ alkyl group, a C$_2$-C$_{20}$ alkenyl group, a C$_2$-C$_{20}$ alkynyl group, a C$_1$-C$_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, isoindolyl group, an indolyl group, an indazolyl group, a purinyl group, a quinolinyl group, an isoquinolinyl group, a benzoquinolinyl group, a quinoxalinyl group, a quinazolinyl group, a cinolinyl group, a carbazolyl group, a phenanthrolinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), —P(=O)(Q$_{31}$)(Q$_{32}$), or one or more combinations thereof.

In one or more embodiments, in Formula 1, L$_1$ and L$_2$ may each independently be a single bond, *—O—*', or *—S—*';

a C$_1$-C$_{20}$ alkylene group, a C$_2$-C$_{20}$ alkenylene group, or a C$_2$-C$_{20}$ alkynylene group, each being unsubstituted or substituted with hydrogen, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a cyclopentyl group, a cyclohexyl group, a phenyl group, a naphthyl group, a pyridinyl group, a pyrimidinyl group, or one or more combinations thereof; or a cyclopentylene group, a cyclohexylene group, a phenylene group, a naphthylene group, a pyridinylene group, or a pyrimidinylene group, each being unsubstituted or substituted with hydrogen, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a C$_1$-C$_{20}$ alkyl group, a C$_2$-C$_{20}$ alkenyl group, a C$_2$-C$_{20}$ alkynyl group, a C$_1$-C$_{20}$ alkoxy group, a cyclopentyl group, a cyclohexyl group, a phenyl group, a naphthyl group, a pyridinyl group, a pyrimidinyl group, or one or more combinations thereof.

In one or more embodiments, in Formula 1, R$_1$, Z$_1$, and Z$_2$ may each independently be hydrogen, deuterium, or a hydroxyl group;

a C$_1$-C$_{20}$ alkyl group, a C$_2$-C$_{20}$ alkenyl group, a C$_2$-C$_{20}$ alkynyl group, or a C$_1$-C$_{20}$ alkoxy group, each being unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), —P(=O)(Q$_{31}$)(Q$_{32}$), or one or more combinations thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, or a pyrimidinyl group, each being unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a C$_1$-C$_{20}$ alkyl group, a C$_2$-C$_{20}$ alkenyl group, a C$_2$-C$_{20}$ alkynyl group, a C$_1$-C$_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), —P(=O)(Q$_{31}$)(Q$_{32}$), or one or more combinations thereof; or —N(Q$_1$)(Q$_2$), but R$_1$ may not be hydrogen.

In one or more embodiments, in Formula 1, R$_1$ may be deuterium or a hydroxyl group;

a C$_1$-C$_{20}$ alkyl group, a C$_2$-C$_{20}$ alkenyl group, a C$_2$-C$_{20}$ alkynyl group, or a C$_1$-C$_{20}$ alkoxy group, each being unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a cyclopentyl group, a cyclohexyl group, a phenyl group, a naphthyl group, a pyridinyl group, a pyrimidinyl group, or one or more combinations thereof;

a cyclopentyl group, a cyclohexyl group, a phenyl group, a naphthyl group, a pyridinyl group, or a pyrimidinyl group, each being unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopentyl group, a cyclohexyl group, a phenyl group, a naphthyl group, a pyridinyl group, a pyrimidinyl group, or one or more combinations thereof; or —$N(Q_1)(Q_2)$. Here, $Q_1$ and $Q_2$ are defined as described in the specification.

In one or more embodiments, in Formula 1, $Z_1$ and $Z_2$ may each independently be hydrogen or deuterium;

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each being unsubstituted or substituted with deuterium, —F, —Cl, —Br, —I, —CDs, —$CD_2H$, —$CDH_2$, —$CF_3$, —$CF_2H$, —$CFH_2$, a hydroxyl group, a cyano group, a nitro group, a cyclopentyl group, a cyclohexyl group, a phenyl group, a naphthyl group, a pyridinyl group, a pyrimidinyl group, or one or more combinations thereof; or a cyclopentyl group, a cyclohexyl group, a phenyl group, a naphthyl group, a pyridinyl group, or a pyrimidinyl group, each being unsubstituted or substituted with deuterium, —F, —Cl, —Br, —I, —CDs, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopentyl group, a cyclohexyl group, a phenyl group, a naphthyl group, a pyridinyl group, a pyrimidinyl group, or one or more combinations thereof.

In one or more embodiments, in Formula 1, $L_1$ may be a single bond, and $R_1$ may be a hydroxyl group.

In one or more embodiments, in Formula 1, $R_1$ may be —$N(Q_1)(Q_2)$.

In one or more embodiments, in Formula 1, a2 may be one of an integer of 1 to 3, i) at least one of $L_2$ in the number of a2 may be a $C_3$-$C_{60}$ carbocyclic group unsubstituted or substituted with at least one $R_{10a}$; ii) $R_1$ may be —$N(Q_1)(Q_2)$; or iii) a combination i) and ii).

In one or more embodiments, in Formula 1, a2 may be an one of integer of 1 to 3, i) at least one of $L_2$ in the number of a2 may be a phenylene group unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a cyclopentyl group, a cyclohexyl group, a phenyl group, a naphthyl group, a pyridinyl group, a pyrimidinyl group, or one or more combinations thereof; ii) $R_1$ may be —$N(Q_1)(Q_2)$; or iii) a combination i) and ii).

In one or more embodiments, the first compound in the etchant may be sulfamide, sulfanilic acid, or a combination thereof.

For example, an amount of the first compound may be at least about 0.10 wt % and not more than about 3.0 wt % with respect to 100 wt % in total of the etchant. When the first compound is included in an amount of less than about 0.10 wt %, due to a reduced chelating effect, and the etch rate cannot be controlled or selected. When the first compound is included in an amount exceeding about 3.0 wt %, the etch rate may excessively increase, thus increasing the generation of tips.

In one or more embodiments, the etchant may include, with respect to 100 wt % in total of the etchant, the persulfate in an amount of at least about 3.0 wt % and not more than about 15.0 wt %, the fluorine-containing compound in an amount of at least about 0.10 wt % and not more than about 2.0 wt %, the chlorine-containing compound in an amount of at least about 0.01 wt % and not more than about 2.0 wt %, the cyclic amine compound in an amount of at least about 0.10 wt % and not more than about 2.0 wt %, the inorganic acid in an amount of at least about 0.10 wt % and not more than about 5.0 wt % or less, and the first compound in an amount of at least about 0.10 wt % and not more than about 3.0 wt %.

In one or more embodiments, the water in the etchant may be deionized water for semiconductor processing. For example, the water may be deionized water of about 18 MO/cm or more. In other embodiments, the water may be included as the remainder. The remainder refers to the quantity needed to reach 100 wt % of the total weight of the etchant including essential component(s) and/or other component(s) of the present disclosure.

For example, the water may be about 70 wt % or more and about 95 wt % or less.

The interfacial permeation inhibition index (Y) is a value of at least about 0.10 and not more than about 0.35 and is calculated by <Equation 1> herein.

The interfacial permeation inhibition index (Y) is an index for controlling the amount of the etchant so as not to cause pores at the interface of the multilayer film when etching the multilayer film with the etchant. The etchant of which Y is at least about 0.10 or more and not more than about 0.35 does not cause pores at the interface due to reduced interfacial permeability with the multilayer film. However, when Y is less than about 0.10 or exceeds about 0.35, due to increased interfacial permeation with the multilayer film, pores may occur at the interface. For example, when manufacturing a display device using the etchant satisfying this range of Y, the multilayer film (for example, a film of Ti/Cu/ITO structure) can be concurrently (e.g., simultaneously) etched, and pores do not occur at the interface of the multilayer film (for example, at the interface between Cu and ITO in the film of Ti/Cu/ITO structure), thus resulting an appropriate or suitable taper angle and lowering a tip occurrence possibility. For example, by controlling the amount of the etchant such that the range of Y is satisfied, the etchant with excellent or suitable etching efficiency and etch uniformity may be efficiently developed, and a high-definition display device may be manufactured.

For example, the Y may be about 0.11 or more and about 0.34 or less. For another example, the Y may be about 0.11 or more and about 0.30 or less.

In one or more embodiments, the etchant may further include a surfactant, a metal ion sequestering agent, an anti-corrosive agent, a heat stabilizer, a thickener, glycol, or one or more combinations thereof.

In one or more embodiments, the etchant may be for etching a metal film, a metal oxide film, or a combination thereof.

In one or more embodiments, the etchant may be for etching a metal film and a metal oxide film.

For example, the metal film may be a single film or a multilayer film.

For example, the metal film may include copper, titanium, a titanium alloy, or one or more combinations thereof. The titanium alloy may include titanium; and molybdenum (Mo), tantalum (Ta), chromium (Cr), nickel (Ni), neodymium (Nd), or one or more combinations thereof (e.g., the titanium alloy may include titanium; and at least one of molybdenum (Mo), tantalum (Ta), chromium (Cr), nickel (Ni), or neodymium (Nd)).

For example, the metal film may include a first metal film and a second metal film. The first metal film may include titanium or a titanium alloy, and the titanium alloy may include titanium; and molybdenum (Mo), tantalum (Ta), chromium (Cr), nickel (Ni), neodymium (Nd), or one or more combinations thereof. The second metal film may include copper.

For example, the metal oxide film may include an oxide of indium (In), tin (Sn), gallium (Ga), zinc (Zn), or one or more combinations thereof. For another example, the metal oxide film may include an oxide of: In; and Sn, Ga, Zn, or one or more combinations thereof (e.g., the metal oxide film may include an oxide of: In; and at least one of Sn, Ga, or Zn). For another example, the metal oxide film may include an oxide of In and Sn (for example, ITO). For example, the first metal film may include titanium, the second metal film may include copper, and the metal oxide film may include ITO. However, embodiments are not limited thereto.

Definition of Terms

The term "$C_3$-$C_{60}$ carbocyclic group" as used herein refers to a cyclic group of 3-60 carbon atoms, consisting of carbons only as ring-forming atoms, and the term "$C_1$-$C_{60}$ heterocyclic group" as used herein refers to a cyclic group of 1-60 carbon atoms, further having, in addition to carbon, a heteroatom, as ring-forming atoms. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_{60}$ heterocyclic group has 3 to 61 ring-forming atoms.

The "cyclic group" as used herein may include the $C_3$-$C_{60}$ carbocyclic group and the $C_1$-$C_{60}$ heterocyclic group.

For example, the $C_3$-$C_{60}$ carbocyclic group may be i) a T1 group or ii) a condensed cyclic group in which at least two T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a condensed cyclic group in which at least two T2 groups are condensed with each other, or iii) a condensed cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like.), the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group.

The term "cyclic group," "$C_3$-$C_{60}$ carbocyclic group," or "$C_1$-$C_{60}$ heterocyclic group" herein may be a group condensed to any cyclic group, a monovalent group, or a polyvalent group (e.g., a divalent group, a trivalent group, a tetravalent group, etc.) depending on the structure of the chemical formula for which the term is used. In one or more embodiments, the "benzene group" may be a benzo group, a phenyl group, a phenylene group, and/or the like, which may be easily understood by one of ordinary skill in the art according to the structure of the chemical formula including the "benzene group."

Examples of the monovalent $C_3$-$C_{60}$ carbocyclic group and the monovalent $C_1$-$C_{60}$ heterocyclic group are a $C_3$-$C_1$ cycloalkyl group, a $C_1$-$C_{10}$ heterocycloalkyl group, a $C_3$-$C_1$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group are a $C_3$-$C_1$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

A $C_1$-$C_{60}$ alkyl group herein refers to a monovalent linear or branched aliphatic hydrocarbon group of 1 to 60 carbon atoms. Specific examples thereof include a methyl group, an ethyl group, a n-propyl group, an isopropyl group, a n-butyl group, a sec-butyl group, an isobutyl group, a tert-butyl group, a n-pentyl group, a tert-pentyl group, a neopentyl group, an isopentyl group, a sec-pentyl group, a 3-pentyl group, a sec-isopentyl group, a n-hexyl group, an isohexyl group, a sec-hexyl group, a tert-hexyl group, a n-heptyl group, an isoheptyl group, a sec-heptyl group, a tert-heptyl group, a n-octyl group, an isooctyl group, a sec-octyl group, a tert-octyl group, an n-nonyl group, an isononyl group, sec-nonyl group, tert-nonyl group, n-decyl group, an isodecyl group, a sec-decyl group, a tert-decyl group, and/or the like. A $C_1$-$C_{60}$ alkylene group herein refers to a divalent group having the same structure as the $C_1$-$C_{60}$ alkyl group.

A $C_2$-$C_{60}$ alkenyl group herein refers to a monovalent hydrocarbon group including one or more carbon-carbon double bonds in the middle or terminal of a $C_2$-$C_{60}$ alkyl group. Specific examples thereof include an ethenyl group, a propenyl group, a butenyl group, and/or the like. A $C_2$-$C_{60}$ alkenylene group herein refers to a divalent group having the same structure as the $C_2$-$C_{60}$ alkenyl group.

A $C_2$-$C_{60}$ alkynyl group herein refers to a monovalent hydrocarbon group including one or more carbon-carbon triple bonds in the middle or terminal of the, $C_2$-$C_{60}$ alkyl group. Specific examples thereof include an ethynyl group, a propynyl group, and/or the like. A $C_2$-$C_{60}$ alkynylene group herein refers to a divalent group having the same structure as the $C_2$-$C_{60}$ alkynyl group.

A $C_1$-$C_{60}$ alkoxy group herein refers to a monovalent group having the formula of —$OA_{101}$ (wherein $A_{101}$ is a $C_1$-$C_{60}$ alkyl group). Specific examples thereof include a methoxy group, an ethoxy group, an isopropyloxy group, and/or the like.

A $C_3$-$C_{10}$ cycloalkyl group herein refers to a monovalent saturated hydrocarbon cyclic group of 3 to 10 carbon atoms. Specific examples thereof include a cyclopropyl group, a cyclobutyl group, a cyclopentyl group, a cyclohexyl group, a cycloheptyl group, and a cyclooctyl group, an adamantanyl group, a norbornanyl group (or bicyclo[2.2.1]heptyl group), a bicyclo[1.1.1]pentyl group, a bicyclo[2.1.1]hexyl group, a bicyclo[2.2.2]octyl group, and/or the like. A $C_3$-$C_{10}$ cycloalkylene group herein refers to a divalent group having the same structure as the $C_3$-$C_{10}$ cycloalkyl group.

A $C_1$-$C_{10}$ heterocycloalkyl group herein refers to a monovalent cyclic group of 1 to 10 carbon atoms, which further includes at least one hetero atom as a ring-forming atom, in addition to carbon atoms. Specific examples thereof include a 1,2,3,4-oxatriazolidinyl group, a tetrahydrofuranyl group, a tetrahydrothiophenyl group, and/or the like. A $C_1$-$C_{10}$ heterocycloalkylene group herein refers to a divalent group having the same structure as the $C_1$-$C_{10}$ heterocycloalkyl group.

A $C_3$-$C_{10}$ cycloalkenyl group herein refers to a monovalent cyclic group of 3 to 10 carbon atoms, which has at least one carbon-carbon double bond in the ring, but does not have aromaticity. Specific examples thereof include a cyclopentenyl group, a cyclohexenyl group, a cycloheptenyl group, and/or the like. A $C_3$-$C_{10}$ cycloalkenylene group herein refers to a divalent group having the same structure as the $C_3$-$C_{10}$ cycloalkenyl group.

A $C_1$-$C_{10}$ heterocycloalkenyl group herein refers to a monovalent cyclic group of 1 to 10 carbon atoms, which further includes at least one hetero atom as a ring-forming atom, in addition to carbon atom, and has at least one double bond in the ring. Specific examples of the $C_1$-$C_{10}$ heterocycloalkenyl group include a 4,5-dihydro-1,2,3,4-oxatriazolyl group, a 2,3-dihydrofuranyl group, a 2,3-dihydrothiophenyl group, and/or the like. A $C_1$-$C_{10}$ heterocycloalkenylene group herein refers to a divalent group having the same structure as the $C_1$-Cia heterocycloalkenyl group.

A $C_6$-$C_{60}$ aryl group herein refers to a monovalent group having a carbocyclic aromatic system of 6 to 60 carbon atoms, and a $C_6$-$C_{60}$ arylene group herein refers to a divalent group having a carbocyclic aromatic system of 6 to 60 carbon atoms. Specific examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubycenyl group, a coronenyl group, an ovalenyl group, and/or the like. When the $C_6$-$C_{60}$ aryl group and the $C_6$-$C_{60}$ arylene group include two or more rings, the two or more rings may be condensed with each other.

A $C_1$-$C_{60}$ heteroaryl group herein refers to a monovalent group having a heterocyclic aromatic system of 1 to 60 carbon atoms, which further include at least one hetero atom as a ring-forming atom, in addition to carbon atoms. A $C_1$-$C_{60}$ heteroarylene group herein refers to a divalent group having a heterocyclic aromatic system of 1 to 60 carbon atoms, which further includes at least one hetero atom as a ring-forming atom, in addition to carbon atoms. Specific examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinolinyl group, a phenanthrolinyl group, a phthalazinyl group, a naphthyridinyl group, and/or the like. When the $C_1$-$C_{60}$ heteroaryl group and the $C_1$-$C_{60}$ heteroarylene group include two or more rings, the two or more rings may be condensed with each other.

A monovalent non-aromatic condensed polycyclic group herein refers to a monovalent group (of, for example, 8 to 60 carbon atoms) having non-aromaticity as the entirety of molecules, which includes at least two rings condensed each other and includes only carbons as ring-forming atoms. Specific examples of the monovalent non-aromatic condensed polycyclic group include an indenyl group, a fluorenyl group, a spiro-bifluorenyl group, a benzofluorenyl group, an indenophenanthrenyl group, an indenoanthracenyl group, and/or the like. A divalent non-aromatic condensed polycyclic group herein refers to a divalent group having the same structure as the monovalent non-aromatic condensed polycyclic group.

A monovalent non-aromatic condensed heteropolycyclic group herein refers to a monovalent group (of, for example, 1 to 60 carbon atoms) having non-aromaticity as the entirety of molecules, which at least two rings condensed each other and further include at least one hetero atom, in addition to carbon atoms. Examples of the monovalent non-aromatic condensed heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphtho silolyl group, a benzofurodibenzofuranyl group, a benzofurodibenzothiophenyl group, and a benzothienodibenzothiophenyl group. A divalent non-aromatic condensed heteropolycyclic group herein refers to a divalent group having the same structure as the monovalent non-aromatic condensed heteropolycyclic group described above.

A $C_6$-$C_{60}$ aryloxy group herein refers to —$OA_{102}$ (wherein $A_{102}$ is a $C_6$-$C_{60}$ aryl group described above), and a $C_6$-$C_{60}$ arylthio group herein refers to —$SA_{103}$ (wherein $A_{103}$ is a $C_6$-$C_{60}$ aryl group described above).

The term "$R_{10a}$" as used herein refers to:
deuterium (-D), —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each being unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or one or more combinations thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each being unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or one or more combinations thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each being unsubstituted or substituted with deuterium, —F, a cyano group, a $C_1$-$C_{60}$ alkyl group, a $C_1$-$C_{60}$ alkoxy group, a phenyl group, a biphenyl group, or one or more combinations thereof; a $C_7$-$C_{60}$ aryl alkyl group; or a $C_2$-$C_{60}$ heteroaryl alkyl group.

The hetero atom herein refers to any atom except a carbon atom. Examples of the hetero atom include O, S, N, P, Si, B, Ge, Se, or one or more combinations thereof.

The term "biphenyl group" as used herein refers to a "phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

and *' as used herein, unless defined otherwise, each refers to a binding site to a neighboring atom in a corresponding formula or moiety.

Hereinafter, embodiments of etchants of the present disclosure will be described in more detail with reference to the following examples. The wording "B was used instead of A" used in describing examples refers to that an identical molar equivalent of B was used in place of A.

Examples 1 to 10 and Comparative Examples 1 to 5

Etchants according to Examples 1 to 10 and Comparative Examples 1 to 5 were prepared to have compositions as in Table 1. In Table 1, % indicates wt %. Then, a Ti/Cu/ITO triple film was formed on a substrate, followed by photoresist patterning of the triple film to manufacture samples. Each etchant was placed in a spray-type etching equipment (Model name: ETCHER (TFT), available from SEMES), and the temperature was set to about 28° C., and thereafter, an etching process was performed on each sample to obtain an etched sample. The etching time was about 50 to about 200 seconds.

In Table 1, APS is ammonium persulfate, SPS is sodium persulfate, KPS is potassium persulfate, ABF is ammonium bifluoride, ACl is ammonium chloride, NaCl is sodium chloride, ATZ is 5-aminotetrazole, $HNO_3$ is nitric acid, SFM is sulfamide, and SFNLA is sulfanilic acid.

Evaluation Example 1

Figure 2:
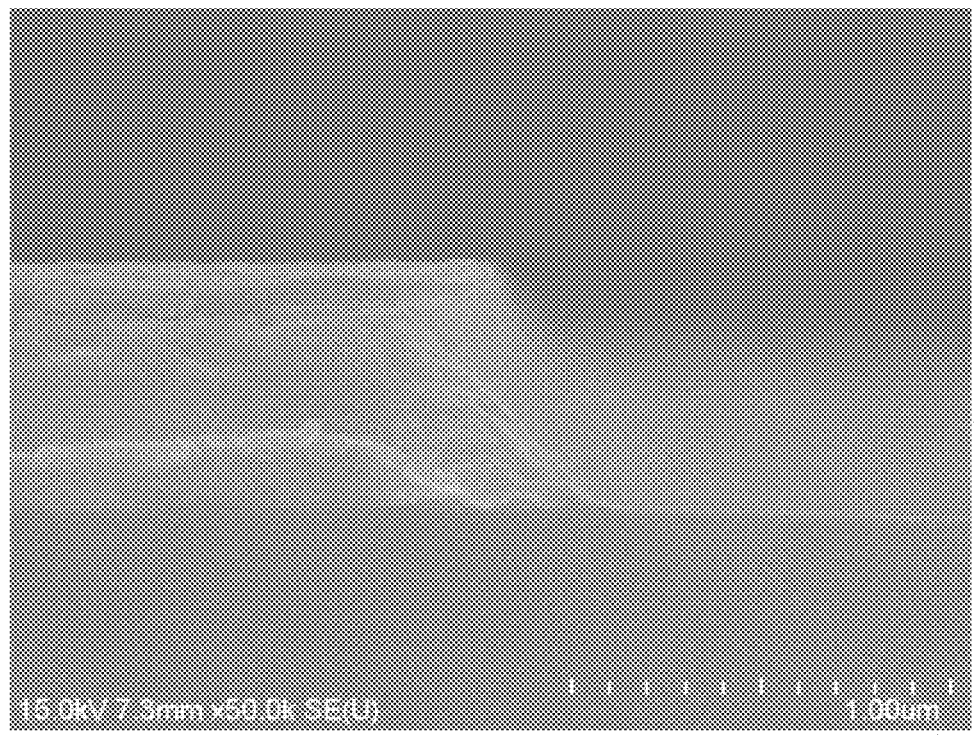
Figure 3:
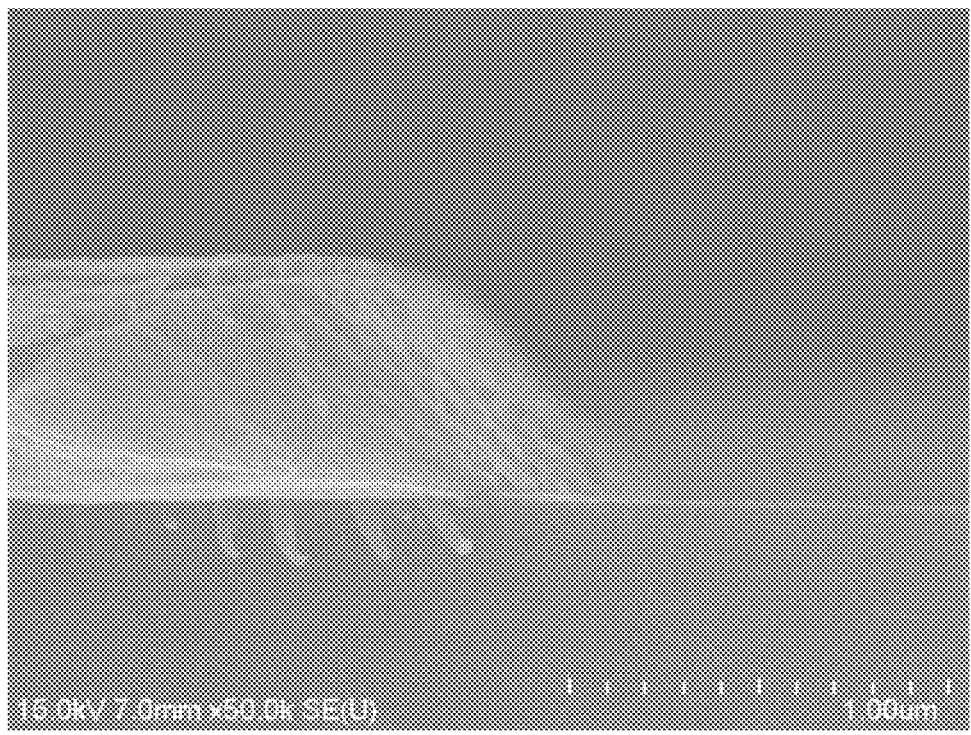
Figure 4:
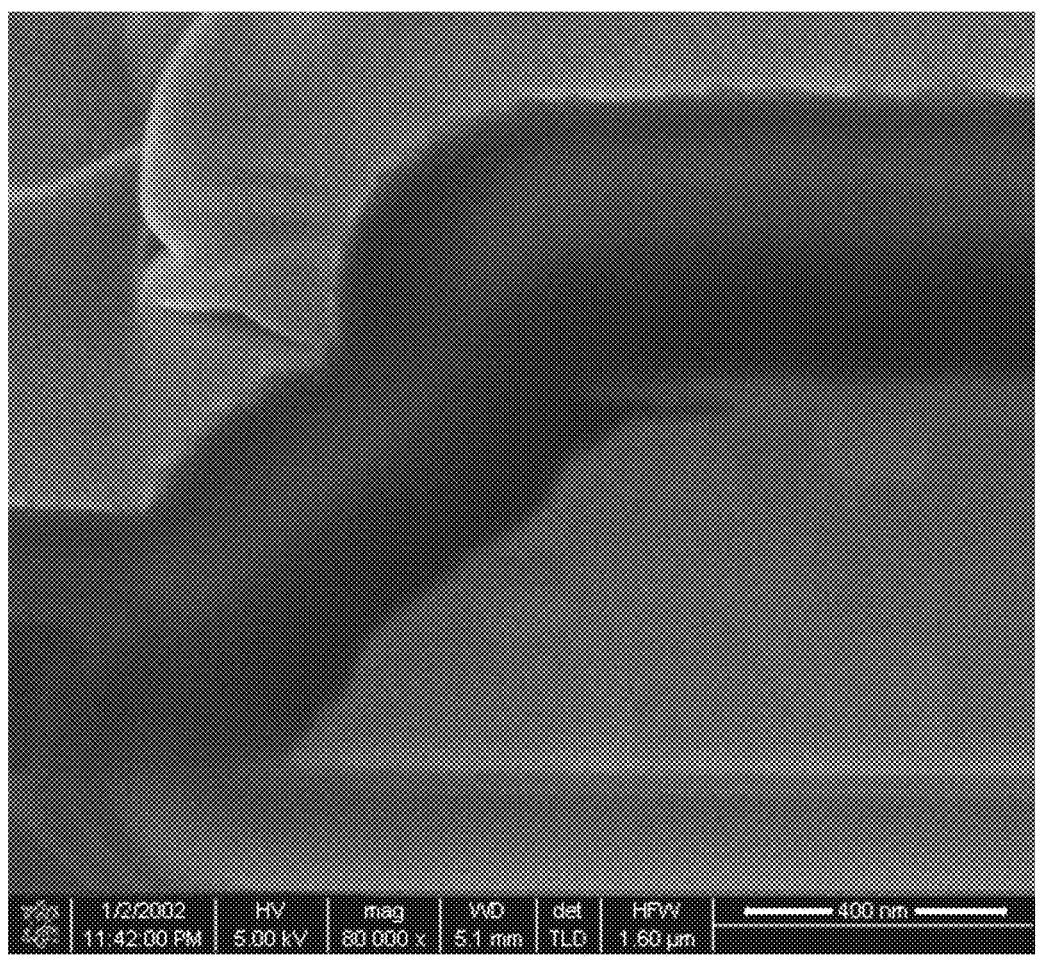
FIGS. 4-5 show results of profile measurement of etched samples of Comparative Examples 1 and 2, respectively, by focused ion beam-scanning electron microscopy (FIB-SEM) according to the present disclosure.
Figure 5:
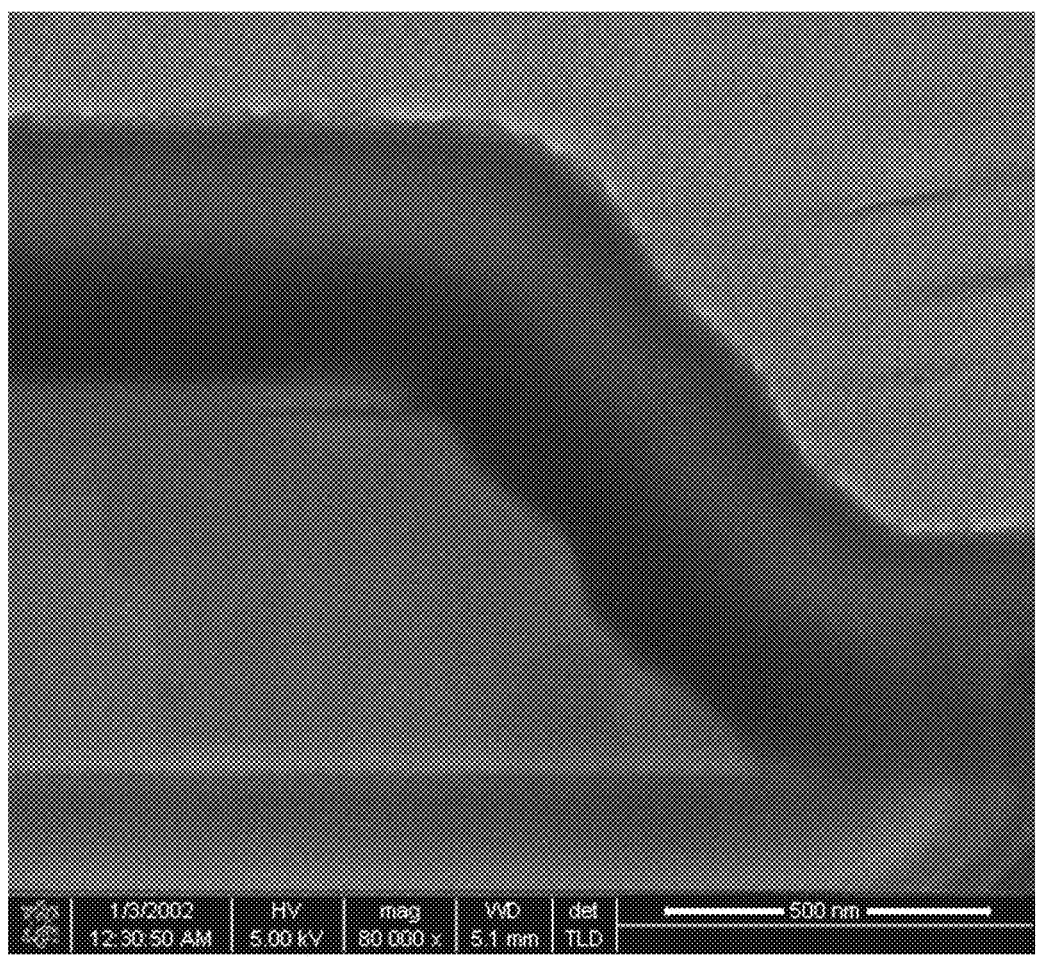
Figure 6:
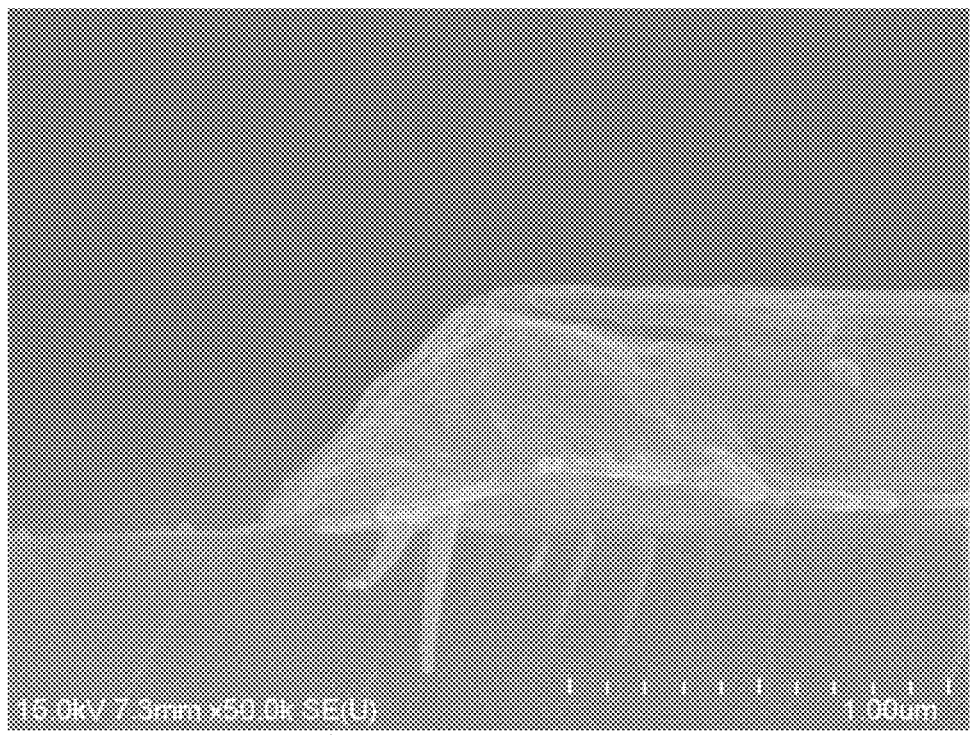
FIGS. 6-8 show results of observation of etched samples of Comparative Examples 3-5, respectively, using a scanning electron microscope according to the present disclosure.
Figure 7:
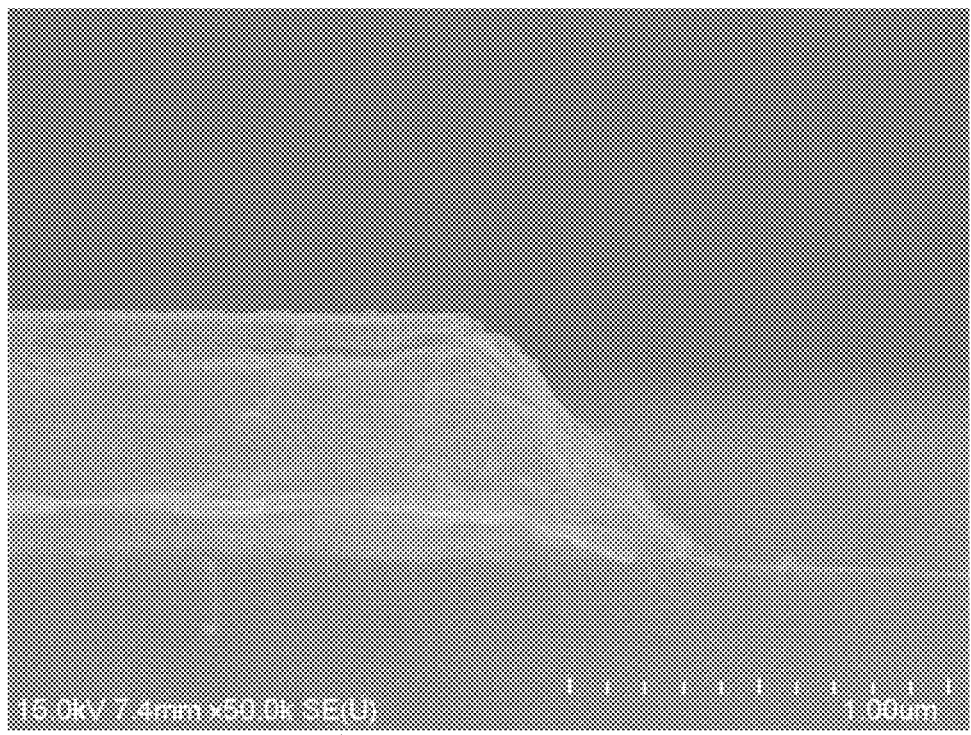
Figure 8:
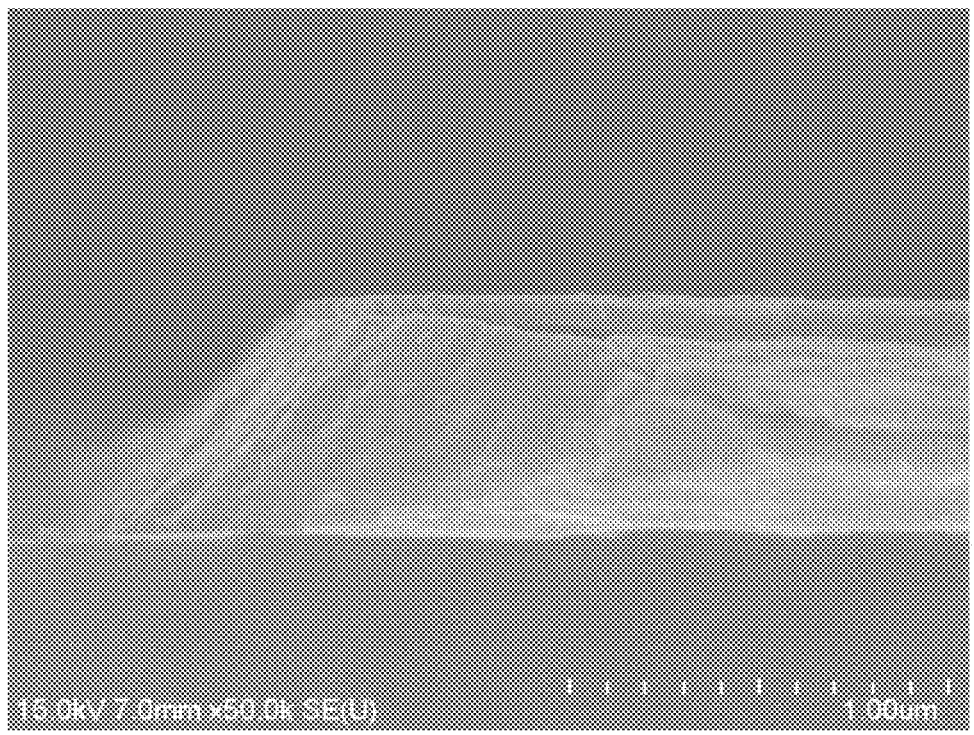

The etched samples according to Examples 1 to 10 and Comparative Examples 1 to 5 were additionally over-etched by 70%, and profiles of the over-etched samples and whether pores occurred were determined using a scanning electron microscope (SEM, Model: S-4700, available from Hitachi) and a focused ion beam-scanning electron microscope (FIB-SEM). The results are shown in Table 1. In Table 1, the case where pores did not occur is marked as "0", and the case where pores occurred is marked as "X". FIGS. 1 to 3 show results of measurement by SEM of profiles of the etched samples of Examples 1 to 3, respectively. FIGS. 4 and 5 show results of measurement by FIB-SEM of profiles of the etched samples of Comparative Examples 1 and 2, respectively, and FIGS. 6 to 8 are results of measurement by SEM of profiles of the etched samples of Comparative Examples 3 to 5, respectively.

TABLE 1

| | Persulfate (%) | | ABF (%) | Chlorine-containing compound (%) | | ATZ (%) | HNO₃ (%) | SFM (%) | SFNLA (%) | Deionized water (%) | Y | Pores occurred or not |
|---|---|---|---|---|---|---|---|---|---|---|---|---|
| Example 1 | SPS | 10.5 | 0.5 | ACl | 0.01 | 1.0 | 3.2 | 0.5 | — | 84.29 | 0.19 | X |
| Example 2 | KPS | 11.0 | 0.6 | ACl | 0.3 | 0.8 | 3.5 | — | 1.0 | 82.8 | 0.27 | X |
| Example 3 | SPS | 7.0 | 0.8 | NaCl | 0.7 | 0.6 | 2.0 | — | 0.3 | 88.6 | 0.21 | X |
| Example 4 | SPS | 9.5 | 0.9 | ACl | 1.2 | 1.8 | 4.0 | 0.2 | — | 82.4 | 0.21 | X |
| Example 5 | SPS | 12.0 | 0.7 | NaCl | 0.01 | 2.0 | 3.3 | 0.1 | — | 81.89 | 0.13 | X |
| Example 6 | APS | 8.0 | 0.7 | ACl | 0.05 | 1.5 | 2.8 | — | 0.1 | 86.85 | 0.14 | X |
| Example 7 | APS | 12.5 | 0.9 | ACl | 0.6 | 0.7 | 3.8 | — | 0.5 | 81 | 0.21 | X |
| Example 8 | APS | 10.0 | 0.5 | NaCl | 0.6 | 0.9 | 2.7 | — | 1.0 | 84.3 | 0.29 | X |
| Example 9 | APS | 12.0 | 0.8 | ACl | 0.01 | 0.1 | 4.0 | 0.4 | — | 82.69 | 0.17 | X |
| Example 10 | APS | 7.5 | 0.6 | ACl | 0.01 | 0.5 | 2.0 | 0.1 | — | 89.29 | 0.14 | X |
| Comparative Example 1 | APS | 13.0 | 0.1 | ACl | 1.5 | 0.5 | 3.0 | — | 2.4 | 79.5 | 0.50 | ○ |
| Comparative Example 2 | SPS | 13.5 | 0.5 | ACl | 1.5 | 1.0 | 1.0 | 1.5 | — | 81 | 0.39 | ○ |
| Comparative Example 3 | SPS | 10.0 | 0.4 | ACl | 1.4 | 1.3 | 3.7 | — | 1.9 | 81.3 | 0.44 | ○ |
| Comparative Example 4 | KPS | 5.0 | 0.7 | NaCl | 1.5 | 0.1 | 1.5 | — | 2.0 | 89.2 | 0.50 | ○ |
| Comparative Example 5 | APS | 14.0 | 0.2 | ACl | 1.5 | 1.5 | 3.8 | 1.7 | — | 77.3 | 0.40 | ○ |

Referring to Table 1, it is found that the etchants of Examples 1 to 10 each exhibited an interfacial permeation inhibition index (Y) of about 0.10 or more and about 0.35 or less, and the etchants of Comparative Examples 1 to 5 each exhibited a Y of greater than about 0.35. It was found that the etched samples of Examples 1 to 10 had excellent or suitable profiles without pore occurrence, whereas the etched samples of Comparative Examples 1 to 5 had substantially non-uniform profiles due to the occurrence of pores.

From FIGS. 1 to 8, the results of the measurements using SEM or FIB-SEM images of Examples 1 to 3 and Comparative Examples 1 to 5 could be confirmed. Referring to FIGS. 1 to 3, it was found that in the samples of Examples 1 to 3, due to less permeation of the etchant at the interface between Cu and ITO, pores did not occur, the taper angle was at least about 45° and not more than about 55°, and excellent or suitable etch profiles were obtained. The etchants used in the samples of Examples 1 to 3 could be obtained by controlling the composition of each etchant (for example, the amounts of the chlorine-containing compound, first compound, persulfate, and water) such that Y of at least about 0.10 and not more than about 0.35 was satisfied. In contrast, referring to FIGS. 4 to 8, it was found that in the samples of Comparative Examples 1 to 5, due to easy permeation of the etchant at the interface between Cu and ITO, pores occurred. Referring to FIGS. 4 and 5, the Cu slope was found to be uneven. This may cause wiring step coverage, and thus, poor substrate erosion or a short circuit may occur. Thus, the etchants used in Examples 1 to 3 were found to have excellent or suitable etching efficiency and etch uniformity, compared to those of the etchants of Comparative Examples 1 to 5.

As described above, according to the one or more embodiments, the etchant is capable of etching a multilayer film, and a defect rate may be reduced when manufacturing display devices by using the etchant.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

As used herein, the terms "use," "using," and "used" may be considered synonymous with the terms "utilize," "utilizing," and "utilized," respectively.

The use of "may" when describing embodiments of the present disclosure refers to "one or more embodiments of the present disclosure."

19

As used herein, the singular forms "a", "an" and "the" are intended to include the plural forms as well, unless the context clearly indicates otherwise.

What is claimed is:

1. An etchant comprising:
   persulfate;
   a fluorine-containing compound;
   a chlorine-containing compound; a cyclic amine compound;
   an inorganic acid;
   a first compound; and water,
   wherein the first compound is a compound comprising:
      a sulfonic group, a sulfonic acid group, or a combination thereof; and
      an amine group, and
   an interfacial permeation inhibition index (Y) of the etchant is a value of at least about 0.10 and not more than about 0.35, the interfacial permeation inhibition index (Y) being a value calculated by <Equation 1>:

$Y=1.4\times10^{-4}\times M(X1)+1.3\times10^{-4}\times M(X2)+1.45\times10^{-3}\times M(X3)+1.5\times10^{-5}\times M(X1)\times M(X2)+1.6\times10^{-3}\times M(X1)\times M(X3)+6.5\times10^{-4}\times M(X2)\times M(X3),$ Equation 1 wherein, in Equation 1,
   M(X1) indicates wt % of the first compound with respect to 100 wt % in total of the etchant,
   M(X2) indicates wt % of the chlorine-containing compound with respect to 100 wt % in total of the etchant, and
   M(X3) indicates wt % of the water with respect to 100 wt % in total of the etchant.

2. The etchant of claim 1, wherein the persulfate comprises ammonium persulfate, sodium persulfate, potassium persulfate, or one or more combinations thereof.

3. The etchant of claim 1, wherein the persulfate is ammonium persulfate.

4. The etchant of claim 1, wherein the fluorine-containing compound comprises aluminum fluoride, sodium fluoride, potassium fluoride, ammonium bifluoride, sodium bifluoride, potassium bifluoride, or one or more combinations thereof.

5. The etchant of claim 1, wherein the chlorine-containing compound comprises hydrochloric acid, sodium chloride, potassium chloride, ammonium chloride, iron (III) chloride, sodium perchlorate, potassium perchlorate, ethanesulfonyl chloride, methanesulfonyl chloride, or one or more combinations thereof.

6. The etchant of claim 1, wherein the cyclic amine compound comprises 5-aminotetrazole, imidazole, indole, purine, pyrazole, pyridine, pyrimidine, pyrrole, pyrrolidine, pyrroline, 5-methyltetrazole, 1-methyl-5-aminotetrazole, 1-ethyl-5-aminotetrazole, or one or more combinations thereof.

7. The etchant of claim 1, wherein the inorganic acid comprises nitric acid, sulfuric acid, phosphoric acid, phosphorous acid, or one or more combinations thereof.

8. The etchant of claim 1, wherein the first compound is a compound comprising a sulfonic group and an amine group, or is a compound comprising a sulfonic acid group and an amine group.

9. The etchant of claim 1, wherein the amine group is $-NH_2$.

10. The etchant of claim 1, wherein the first compound is a compound represented by Formula 1:

20

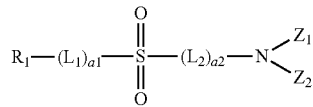

Formula 1 wherein, in Formula 1, $L_1$ and $L_2$ are each independently single bond, *—O—*', *—S—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, a1 and a2 are each independently one of an integer from 0 to 3, $R_1$, $Z_1$, and $Z_2$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $-N(Q_1)(Q_2)$, $-B(Q_1)(Q_2)$, $-P(Q_1)(Q_2)$, or $-C(=O)(Q_1)$, but $R_1$ is not hydrogen, $Z_1$ and $Z_2$ are optionally linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and $R_{10a}$ is deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each being unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-Coo arylthio group, $-Si(Q_{11})(Q_{12})(Q_{13})$, $-N(Q_{11})(Q_{12})$, $-B(Q_{11})(Q_{12})$, $-C(=O)(Q_{11})$, $-S(=O)_2(Q_{11})$, $-P(=O)(Q_{11})(Q_{12})$, or one or more combinations thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each being unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $-Si(Q_{21})(Q_{22})(Q_{23})$, $-N(Q_{21})(Q_{22})$, $-B(Q_{21})(Q_{22})$, $-C(=O)(Q_{21})$, $-S(=O)_2(Q_{21})$, $-P(=O)(Q_{21})(Q_{22})$, or one or more combinations thereof; or $-Si(Q_{31})(Q_{32})(Q_{33})$, $-N(Q_{31})(Q_{32})$, $-B(Q_{31})(Q_{32})$, $-C(=O)(Q_{31})$, $-S(=O)_2(Q_{31})$, or $-P(=O)(Q_{31})(Q_{32})$, and wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F;

—Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each being unsubstituted or substituted with deuterium, —F, a cyano group, a $C_1$-$C_{60}$ alkyl group, a $C_1$-$C_{60}$ alkoxy group, a phenyl group, a biphenyl group, or one or more combinations thereof.

11. The etchant of claim 10, wherein $L_1$ and $L_2$ are each independently a single bond, *—O—*', or *—S—*';
a $C_1$-$C_{20}$ alkylene group, a $C_2$-$C_{20}$ alkenylene group, or a $C_2$-$C_{20}$ alkynylene group, each being unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a cyclopentyl group, a cyclohexyl group, a phenyl group, a naphthyl group, a pyridinyl group, a pyrimidinyl group, or one or more combinations thereof; or
a cyclopentylene group, a cyclohexylene group, a phenylene group, a naphthylene group, a pyridinylene group, or a pyrimidinylene group, each being unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopentyl group, a cyclohexyl group, a phenyl group, a naphthyl group, a pyridinyl group, a pyrimidinyl group, or one or more combinations thereof.

12. The etchant of claim 10, wherein $R_1$ is:
deuterium or a hydroxyl group;
a $C_1$-$C_{20}$ alkyl group, a $C_2$-$C_{20}$ alkenyl group, a $C_2$-$C_{20}$ alkynyl group, or a $C_1$-$C_{20}$ alkoxy group, each being unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a cyclopentyl group, a cyclohexyl group, a phenyl group, a naphthyl group, a pyridinyl group, a pyrimidinyl group, or one or more combinations thereof;
a cyclopentyl group, a cyclohexyl group, a phenyl group, a naphthyl group, a pyridinyl group, or a pyrimidinyl group, each being unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopentyl group, a cyclohexyl group, a phenyl group, a naphthyl group, a pyridinyl group, a pyrimidinyl group, or one or more combinations thereof; or
—$N(Q_1)(Q_2)$.

13. The etchant of claim 10, wherein $Z_1$ and $Z_2$ are each independently:
hydrogen or deuterium;
a $C_1$-$C_{20}$ alkyl group, a $C_2$-$C_{20}$ alkenyl group, a $C_2$-$C_{20}$ alkynyl group, or a $C_1$-$C_{20}$ alkoxy group, each being unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a cyclopentyl group, a cyclohexyl group, a phenyl group, a naphthyl group, a pyridinyl group, a pyrimidinyl group, or one or more combinations thereof; or
a cyclopentyl group, a cyclohexyl group, a phenyl group, a naphthyl group, a pyridinyl group, or a pyrimidinyl group, each being unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopentyl group, a cyclohexyl group, a phenyl group, a naphthyl group, a pyridinyl group, a pyrimidinyl group, or one or more combinations thereof.

14. The etchant of claim 10, wherein $L_1$ is a single bond, and $R_1$ is a hydroxyl group.

15. The etchant of claim 10, wherein $R_1$ is —$N(Q_1)(Q_2)$.

16. The etchant of claim 10, wherein a2 is one of an integer of 1 to 3, and i) at least one of $L_2$ in a number of a2 is a $C_3$-$C_{60}$ carbocyclic group unsubstituted or substituted with at least one $R_{10a}$; ii) $R_1$ is —$N(Q_1)(Q_2)$; or iii) a combination i) and ii).

17. The etchant of claim 1, wherein the first compound is sulfamide, sulfanilic acid, or a combination thereof.

18. The etchant of claim 1, wherein, with respect to 100 wt % in total of the etchant,
an amount of the persulfate is at least about 3.0 wt % and not more than about 15.0 wt %,
an amount of the fluorine-containing compound is at least about 0.10 wt % and not more than about 2.0 wt %,
an amount of the chlorine-containing compound is at least about 0.01 wt % and not more than about 2.0 wt %,
an amount of the cyclic amine compound is at least about 0.10 wt % and not more than about 2.0 wt %,
an amount of the inorganic acid is at least about 0.10 wt % and not more than about 5.0 wt %, and
an amount of the first compound is at least about 0.10 wt % and not more than about 3.0 wt %.

19. The etchant of claim 1, wherein an amount of the water is at least about 70 wt % and not more than about 95 wt %, with respect to 100 wt % in total of the etchant.

20. The etchant of claim 1, wherein Y is at least about 0.11 and not more than about 0.30.

* * * * *